United States Patent [19]

Telser et al.

[11] Patent Number: 5,460,920
[45] Date of Patent: Oct. 24, 1995

[54] PHOTOCHEMICAL OR MECHANICAL PRODUCTION OF FLEXIBLE PRINTING PLATES

[75] Inventors: Thomas Telser, Weinheim; Heinz-Ulrich Werther, Wachenheim; Manfred Zuerger, Sinsheim, all of Germany

[73] Assignee: BASF Lacke + Farben Aktiengesellschaft, Muenster, Germany

[21] Appl. No.: 319,092

[22] Filed: Oct. 6, 1994

Related U.S. Application Data

[60] Continuation of Ser. No. 170,986, Dec. 21, 1993, abandoned, which is a division of Ser. No. 14,170, Feb. 5, 1993, abandoned.

[30] Foreign Application Priority Data

Feb. 7, 1992 [DE] Germany ............... 42 03 608.9

[51] Int. Cl.$^6$ ....................................... G03F 7/00
[52] U.S. Cl. ........................ 430/309; 430/306; 430/308
[58] Field of Search ................................. 430/291, 306, 430/308, 309

[56] References Cited

U.S. PATENT DOCUMENTS

| | | | |
|---|---|---|---|
| 4,284,731 | 8/1981 | Moser et al. ............... | 525/28 |
| 4,320,188 | 3/1982 | Heinz et al. ............... | 430/281 |
| 5,041,360 | 8/1991 | Schlosser ............... | 430/306 |
| 5,100,763 | 3/1992 | Kimoto et al. ............... | 430/306 |
| 5,128,234 | 7/1992 | Telser ............... | 430/306 |
| 5,147,757 | 9/1992 | Kurtz et al. ............... | 430/281 |
| 5,175,076 | 12/1992 | Ishikawa et al. ............... | 430/306 |
| 5,212,049 | 5/1993 | Gersdorf ............... | 430/306 |
| 5,292,617 | 3/1994 | Feinberg et al. ............... | 430/271 |

FOREIGN PATENT DOCUMENTS 386514 9/1990 European Pat. Off. .

*Primary Examiner*—Hoa Van Le
*Attorney, Agent, or Firm*—Keil & Weinkauf

[57] ABSTRACT

Flexible printing plates are produced from printing plates consisting essentially of a dimensionally stable substrate (1) and a recording layer (2) by a process in which the printing plate is produced alternatively either by photochemical or by mechanical structuring, and in the case of photochemical structuring the photosensitive recording layer (2) is exposed imagewise and the unexposed parts of the recording layer (2) are washed out with a developer and in the case of mechanical structuring the originally photosensitive, uniformly exposed recording layer (2) is cut imagewise and the nonprinting parts of the recording layer are peeled off from the substrate (1).

The printing plates produced by this process are suitable for the production of products printed by the flexographic method and for lacquering products printed by the offset method.

10 Claims, No Drawings

US 5,460,920

PHOTOCHEMICAL OR MECHANICAL PRODUCTION OF FLEXIBLE PRINTING PLATES

This application is a continuation of U.S. application Ser. No. 08/170,986, filed on Dec. 21, 1993, now abandoned, which is a divisional of U.S. application Ser. No. 08/014,170, filed on Feb. 5, 1993, now abandoned.

The present invention relates to a process for the production of flexible printing plates from printing plates consisting essentially of a dimensionally stable substrate and a recording layer, wherein the printing plates are produced alternatively either by photochemical or by mechanical structuring. The flexible printing plates thus produced are suitable both for producing products printed by the flexographic method and for lacquering products printed by the offset method.

Various systems are used as printing plates for offset lacquering.

In solid lacquering, rubber blankets are used. The disadvantage here is the piling of the still moist offset ink on the rubber blanket. The printing process has to be interrupted and the rubber blanket cleaned.

If only a few areas are to be omitted during application of the lacquer, the areas are cut out of the rubber blanket and peeled off manually. The disadvantages of this system are insufficient dimensional stability of the structured rubber blanket, which prevents lacquer application exactly in register during long print runs, distortion of the rubber blanket when the uppermost layer is peeled off, the low resolution and the piling of the offset ink. Photopolymeric flexographic printing plates are generally used for spot lacquering. The disadvantages here are the high cost of plate production (film production, exposure, washing out in organic developers, drying and after treatment) and the piling.

It is an object of the present invention to make the process for the production of flexible printing plates for flexographic printing and in particular for use as offset lacquering plates simpler and more variable.

We have found that this object is achieved, according to the invention, essentially by a printing plate which, depending on the required resolution, can be mechanically structured or imagewise exposed, washed out and dried. Mechanical structuring in this context means that the nonprinting parts are cut out of the printing plate imagewise, for example by means of a computer-controlled knife or manually, and peeled off.

The present invention relates to a process for the production of a flexible printing plate from a printing plate consisting essentially of a dimensionally stable substrate (1) and a recording layer (2), wherein the printing plate is produced alternatively either by photochemical or by mechanical structuring, in the case of photochemical structuring the photosensitive recording layer (2) being exposed imagewise and the unexposed parts of the recording layer (2) being washed out with a developer and in the case of mechanical structuring the originally photosensitive, uniformly exposed recording layer (2) being cut imagewise and the nonprinting parts of the recording layer (2) being peeled off the substrate (1).

A protective film (3) may be present on the recording layer (2).

A thin nontacky release layer (2a), which in the case of photochemical structuring is removed after the imagewise exposure and in the case of mechanical structuring is peeled off or washed off before or after imagewise cutting, may be present between the photosensitive recording layer (2) and the protective film (3).

An adhesion-promoting layer (1a) may additionally be arranged between the recording layer (2) and the dimensionally stable substrate (1).

A dimensionally stable film of a plastic is preferred as the dimensionally stable substrate (1).

In a preferred embodiment of the novel process, the adhesion of the recording layer (2) to the dimensionally stable substrate (1) or to an adhesion-promoting layer (1a) present on the dimensionally stable substrate (1) is more than 1 N/cm and less than 10 N/cm.

In the case of mechanical structuring, the tensile strength of the recording layer (2) is preferably more than 0.2 N/mm$^2$ and less than 20 N/mm$^2$.

In other preferred embodiments of the novel process, the hardness of the exposed recording layer (2) is more than 20 and less than 80 Shore A and, in the case of photochemical structuring, water or aqueous solutions are used as developers.

The photosensitive recording layer (2) preferably contains a mixture of a hydrophobic and a hydrophilic binder in amounts such that the exposed recording layer (2) washed out with a developer exhibits a weight increase of >1 and <30% by weight after storage for 24 hours in water at room temperature.

The present invention furthermore relates to a process for the production of products printed by the flexographic method, wherein the printing plates used are those which are produced by a novel process, and to a process for lacquering products printed by the offset method, wherein lacquer transfer is effected by the printing plates produced by a novel process.

The novel process will now be more particularly described.

The printing plate to be used for the novel process consists essentially of a dimensionally stable substrate (1), for example of a dimensionally stable substrate film having a thickness of from 100 to 300 μm, on which a thin adhesion-promoting layer having a thickness of from 0.1 to 10 μm (1a) has been preferably applied, and the actual recording layer (2) which is applied thereon and may be from about 200 to 8,000 μm thick. A nontacky release layer (2a) which may be from about 1 to 5 μm thick may be applied to the latter and is advantageous for good adhesion to the negative during exposure. A protective film or cover sheet (3) having a thickness of from about 10 to 200 μm may be present thereon in order to protect the printing plate from damage.

The recording layer (2) is photosensitive, i.e. it can be crosslinked by imagewise exposure. If the printing plate is to be mechanically structured, the recording layer is uniformly crosslinked before cutting, and, where present, the nontacky release layer is removed by washing.

The recording layer (2) can in principle contain all formulations known for flexographic printing plates. Usually, such a formulation consists of one or more elastomeric binders, one or more ethylenically unsaturated compounds, a photoinitiator, a stabilizer and, if required, further assistants.

If the conventional block copolymers of styrene and butadiene or isoprene are used as binders, the printing plates exhibit the phenomenon of piling when they are used as offset lacquering plates, i.e. the still moist offset printing ink sticks to the printing plate and piles up there.

This disadvantage is not exhibited by photosensitive mixtures as described in EP-A-0 386 514.

Piling of the offset ink is closely coupled with the swelling of the printing plate in water-based lacquer. If the swelling of the exposed printing plate in water-based lacquer is too low (<1% by weight after storage for 24 hours), the offset ink becomes attached to the surface of the printing plate (=varnishing plate) after only a few sheets have been printed. If the swelling is too high (>30% by weight), unacceptable size changes and delamination of individual relief elements occur during the print run.

The formulations stated in EP-A-0 386 514 have the advantage here that they contain a hydrophilic and a hydrophobic binder. The swelling of the recording layer in water-based lacquer can therefore be exactly adjusted by means of the amounts of the binder components. Mixtures which contain the hydrophilic and the hydrophobic binder in about equal amounts are optimal. These formulations exhibit no piling at all and have a long press life. The swelling in various water-based lacquers is from 3 to 15% by weight.

These formulations additionally have the advantage that they can be developed in water or aqueous solutions.

If the printing plates are to be only mechanically structured, the recording layer need not of course be photosensitive and then also need not be exposed uniformly prior to cutting. It is then possible to dispense with the addition of ethylenically unsaturated compounds and a photoinitiator. However, the combinations of a hydrophilic and a hydrophobic binder, stated in EP-A-386 514, proved to be particularly suitable also for purely mechanical structuring. These binder combinations give printing plates having suitable hardness and high resolution in the case of mechanical structuring.

Water-soluble, partially or completely hydrolyzed polyvinyl alcohols and polyvinyl alcohol/ethylene oxide graft copolymers (cf. for example Mowiol® 04/86 from Hoechst AG) are suitable as nontacky release layer (2a).

The substrate film (1) preferably has a thickness of from 150 to 300 μm. The substrate film imparts to the printing plate the necessary dimensional stability and should not be deformed when the nonimage parts are peeled off. A 300 μm thick polyethylene terephthalate film proved to be particularly suitable. To achieve good binding of the substrate film to the adhesion-promoting layer, it is advantageous to pretreat the film with a primer. Pretreated polyethylene terephthalate films are commercially available (for example from the companies Kalle, Toray and Rhone-Poulenc).

As already mentioned above, an adhesion-promoting layer (thickness from 0.1 to 5 μm) is preferably present between the substrate film and the recording layer and enables a defined adhesion to be obtained. The adhesion of the adhesion-promoting layer to the exposed recording layer may be of decisive importance for the quality of imagewise cutting.

If the adhesion to the exposed recording layer is too high, the nonimage parts can be peeled off from the substrate film only with very great difficulty, if at all, after cutting. On the other hand, if the adhesion is too low, delamination of individual relief elements occurs during the printing process. The adhesion should therefore be more than 2 and less than 20 N/2 cm. The optimum adhesion is from 5 to 10 N/2 cm.

The adhesion of the exposed recording layer to the substrate film should advantageously also be matched by the tensile strength of the exposed recording layer.

If it is assumed that a strip about 5 cm wide is to be peeled off when the nonimage parts are removed, the material should be able to absorb forces of 12.5 N without tearing in the case of an adhesion of 5 N/2 cm. The tensile strength of a 1 mm thick recording layer should then be greater than 0.25 N/mm².

Furthermore, the tear propagation strength of the exposed material and the uniformity of tearing are important for the quality of the cutting result. The uniformity of tearing can be determined by measuring tear propagation strength according to DIN 53,507. A scored test specimen is clamped in a tensile tester and the force curve is recorded as a function of the distance. If the force required to tear the specimen is constant within +/–2%, the tear is propagated uniformly in the material at a constant speed, and smooth, satisfactory edges are obtained on imagewise cutting of the exposed printing plate.

If, on the other hand, the force/distance diagram of the exposed recording layer shows pronounced force peaks, i.e. the force fluctuates stepwise by more than +/– 2%, the tear is propagated nonuniformly in the material. The edges of the image elements are then irregularly scored, so that the transfer of information is not sufficiently exact.

The hardness of the exposed recording layer is also of importance. Uniform lacquer application without squash is achieved in particular with layers whose Shore A hardness is from 30 to 70 units (measured using 6 mm thick specimens).

If the printing plate meets all the above-mentioned requirements with regard to the mechanical properties, a resolution of up to 1 mm can be achieved in the case of manual structuring. This means that isolated dots and lines and also negative elements having a size >1 mm can be satisfactorily produced. The resolution of a cut rubber blanket on the other hand is only about 1 cm.

The cutting process can be carried out either manually or in a computer-controlled cutting apparatus. Manual cutting entails the danger that the substrate film will be scored and will lose its stability. In an automatic cutting apparatus, on the other hand, the lowering of the knife can be very exactly adjusted (+/– 20 μm), so that the substrate film is not damaged. In addition, the cutting speed can be matched to the material, leading to a further improvement in the cutting result. Automatically operating cutting apparatuses are commercially available (e.g. Marbaplot® from Marbach etc.).

The cut-out elements can be lifted off manually. If the areas to be removed are too large, it is useful to make additional assisting cuts during cutting. Strips having a width of up to 5 cm are particularly easy to peel off.

The Examples which follow illustrate the invention. Parts and percentages are by weight unless stated otherwise.

EXAMPLE 1

A photosensitive mixture was processed in a twin-screw extruder (e.g. ZSK 53 from Werner & Pfleiderer). The formulation for the photosensitive recording layer (2) contains the following components:

40 parts of an ethylene/acrylic acid/acrylate copolymer consisting of 60% by weight of ethylene, 20% by weight of acrylic acid and 20% by weight of 2-ethylhexyl acrylate (melt flow index MFI (160° C., 325 g)=15)

40 parts of an ethylene/propylene/diene rubber (e.g. Buna AP 251 from Hüls, containing 50% by weight of ethylene and 14 double bonds per 1000 carbon atoms and having a Mooney viscosity ML (1+4)/100° C. of 45)

3.0 parts of glycidyl methacrylate 5.0 parts of hexanediol diacrylate 1.0 part of benzil dimethyl ketal 1.0 part of 2,6-di-tert-butyl-p-cresol (Kerobit® TBK)

9.0 parts of butylethanolamine 1.0 part of N-nitroso-N-cyclohexylhydroxylamine (potassium salt)

0.004 part of Safranine T (C.I. 50,240)

The two binders were metered into the twin-screw extruder.

After the melting zone, glycidyl methacrylate, the mixture of hexanediol diacrylate, benzil dimethyl ketal and 2,6-di-tert-butyl-p-cresol and then butylethanolamine were metered in. Finally, a 30% strength aqueous solution of Safranine T and the potassium salt of N-nitroso-N-cyclohexylhydroxylamine were metered in. The total throughput was 20 kg/h. The temperature in the melting zone was about 150° C., that in the mixing zone about 130° C. and that in the discharge zone about 115° C.

The solvents were recovered from the melt in a devolatization dome.

The melt discharged from the slot die was passed into the nip (thickness 1.3 mm) of a two-roll calender, where the melt was smoothed and was firmly bonded to the cover sheet and substrate film running in over the calender rollers.

The cover sheet used was a 125 μm polyethylene terephthalate film (Mylar® from DuPont de Nemours), which had been coated beforehand on one side with a 5 μm thick nontacky release layer of a polyvinyl alcohol/ethylene oxide graft copolymer (Mowiol® 04/86 from Hoechst AG).

The substrate film used was a 300 μm thick, precoated polyethylene terephthalate film (e.g. Hostaphan® RN from Hoechst AG). This film was coated with a mixture of adhesion-forming components in a thickness of 5 μm. The mixture of adhesive-forming components used for this purpose consisted of a mixture of equal amounts of polycarbonate (e.g. Makrolon® 2800 from Albis Plastic Chemie GmbH), phenoxy resin (e.g. PKHH from Brenntag, Mülheim/Ruhr) and an isocyanate-based crosslinking agent (e.g. Desmodur® L from Bayer AG).

The films were introduced into the calender so that the photosensitive melt was bonded to the nontacky release layer and the adhesion-promoting layer. Thereafter, the laminate was cooled on a vacuum suction belt and cut to size.

A. Photochemical structuring

The cover sheet was peeled off from the printing plate and a negative was placed on top. The plate was covered with a vacuum film and was exposed imagewise to actinic light (wavelength from 350 to 400 μm) for 10 minutes in a 70 watt exposure unit under reduced pressure.

The negative was removed and the plate was washed out down to the substrate film in 1% strength sodium carbonate solution in a drum-type brush washer at 50° C. in the course of 12 minutes. The printing plate was then dried for 2 hours at 60° C. and then post-exposed for a further 10 minutes.

The printing plate thus obtained is referred to as printing plate (1a).

B.1 Mechanical structuring

The printing plate was exposed uniformly from both sides for 10 minutes without applying reduced pressure. The cover sheet was then peeled off and the printing plate was immersed for 10 minutes in 1% strength sodium carbonate solution. During this procedure, the thin nontacky release layer became detached.

The crosslinked and nontacky printing plate was then placed on the cutting table of a computer-controlled cutting apparatus (Marbaplot from Marbach), sucked against the table under reduced pressure and cut. The original produced in the computer contained positive and negative elements (solid areas, lines, circles and dots) of variable size (from 0.5 mm to a few cm). The cutting depth of the knife was adjusted to the thickness of the recording layer plus an additional 20 μm. The cutting speed was 3 cm/s.

The printing plate thus obtained is referred to as printing plate (1b).

B.2 Mechanical structuring

The printing plate was exposed uniformly from the front for 10 minutes without applying reduced pressure. The cover sheet was then peeled off. The printing plate was then cut using a computer-controlled cutting apparatus. The nonimage parts were peeled off.

The thin nontacky release layer was then removed by rubbing with a plush pad soaked in a 1% strength sodium carbonate solution.

The printing plate thus obtained is referred to as printing plate (1c).

COMPARATIVE EXAMPLE 1

The mixture below was processed according to Example 1 in a twin-screw extruder. 83 parts of styrene/isoprene/styrene block copolymer (Cariflex® 1107 from Shell)
5 parts of hexanediol diacrylate
5 parts of hexanediol dimethacrylate
5 parts of liquid paraffin (white oil S 5000)
1 part of benzil dimethyl ketal
1 part of 2,6-di-tert-butyl-p-cresol
0.006 part of Sudan Deep Black BB (C.I. 26,150)

The melt was firmly bonded to the cover sheet and substrate film in a calender, as in Example 1.

A conventional 125 μm thick polyethylene terephthalate film (Mylar) which had been coated beforehand on one side with a 5 μm thick nontacky release layer of a polyamide (Makromelt® 6900 from Henkel) was introduced as a cover sheet.

A. Photochemical structuring

A printing plate was produced from the raw plate. For this purpose, it was first necessary to produce a negative from the original. Thereafter, the cover sheet was peeled off and the negative was placed on the printing plate. The laminate was covered with a transparent vacuum film and exposed imagewise for 10 minutes under reduced pressure.

After removal of the negative, the printing plate was washed out in a mixture of 80 parts by volume of Exxsol® D 60 and 20 parts by volume of n-pentanol in a drum-type brush washer. The temperature of the washout solution was 30° C. After a washout time of 15 minutes, the printing plate had been washed out down to the adhesion-promoting mixture of the substrate film. The printing plate was then dried for 2 hours at 60° C. and, after standing for 12 hours, was then detackified by immersion in an aqueous bromine solution for 5 minutes.

The printing plate thus obtained is referred to as printing plate (2a).

B. Mechanical structuring

The printing plate was exposed uniformly from both sides for 10 minutes. Thereafter, the cover sheet was peeled off and the printing plate was treated for 2 minutes in a drum-type brush washer with n-pentanol. During this procedure, the thin nontacky release layer becomes detached. The printing plate was then dried for 10 minutes at 60° C. and, after cooling to room temperature, was detackified by immersion in an aqueous bromine solution.

The printing plate was then structured mechanically according to Example 1.

The printing plate thus obtained is referred to as printing plate (2b).

COMPARATIVE EXAMPLE 2

A rubber blanket conventionally used for offset lacquering was mechanically structured, the rubber blanket being placed on the cutting table of a computer-controlled cutting apparatus (e.g. Marbaplot), sucked against the table under reduced pressure and cut. The original produced in the computer corresponded to that used in Example 1.

The printing plate thus obtained is referred to as printing plate (3).

EXAMPLE 2

A photosensitive mixture was processed in a twin-screw extruder. The formulation contained the following components:
40 parts of ethylene/acrylic acid/acrylate copolymer (as in Example 1)
40 parts of ethylene/propylene/diene rubber (BunaAP 251) (as in Example 1)
3.0 parts of glycidyl methacrylate
5.0 parts of hexanediol diacrylate
1.0 part of benzil dimethyl ketal
1.0 part of 2,6-di-tert-butyl-p-cresol (Kerobit TBK)
5.0 parts of isophoronediamine The melt emerging from the slot die was passed into the nip (thickness 1.3 mm) of a two-roll calender, where the melt was smoothed and was firmly bonded to the cover sheet and substrate film.

The substrate film used was 300 µm thick, pre-coated polyethylene terephthalate film (Hostaphan RN from Hoechst AG), which had been coated beforehand with a mixture of adhesion-promoting components in a thickness of 5 µm.

The cover sheet employed was a 75 µm thick, uncoated polyethylene terephthalate film (Hostaphan RN from Hoechst AG).

The laminate was peeled off by means of a vacuum suction belt. The raw plates passed through an exposure station. The residence time of the plates under the lamps and the luminous intensity of the lamps corresponded to an exposure time of 5 minutes in a 70 W exposure unit.

Mechanical structuring

The printing plate was placed on the cutting table of a computer-controlled cutting apparatus, the cover sheet was removed, the plate was sucked against the table under reduced pressure and cutting was carried out according to Example 1 (production of printing plate (1b)).

The printing plate thus obtained is referred to as printing plate (4).

The results obtained with the individual printing plates are summarized in the Table below.

TABLE

| Test parameter | Printing plate | | | | | | |
|---|---|---|---|---|---|---|---|
| | (1a) | (1b) | (1c) | (2a) | (2b) | (3) | (4) |
| Properties of printing plate | | | | | | | |
| Shore A (6 mm sample) | 39 | 40 | 40 | 46 | 48 | /1/ | 50 |
| Adhesion printing layer/substrate in N/2 cm /2/ | 7 | 9 | 9 | 8 | 10 | 8 | 8 |
| Tensile test /3/ Elongation at break in % | 210 | 220 | 220 | 350 | 400 | /1/ | 160 |
| Tensile strength in N/mm$^2$ | 1.8 | 2.0 | 2.0 | 1.9 | 2.3 | /1/ | 3.1 |
| Tear propagation strength according to DIN 53,507 Median in N/mm | 1.7 | 1.8 | 1.8 | 1.9 | 2.2 | /1/ | 2.6 |
| Range in N/mm /4/ | 0 | 0 | 0 | 0.5 | 0.6 | /1/ | 0 |
| Cutting result | | | | | | | |
| Edge sharpness | | good | good | jagged | good | good | |
| Peelability of large areas | | good | good | tears/5/ | good | good | |
| Peelability of negative elements | | good | good | moderate | poor | good | |
| Resolution | | 1 mm | 1 mm | 5 mm | 10 mm | 1 mm | |
| Print test /6/ | | | | | | | |
| Copies before piling | >50,000 | >50,000 | >50,000 | 500 | 1,000 | 3,000 | >50,000 |
| Accuracy of register | good | good | good | good | good | poor | good |
| Swelling in lacquer /7/ | 9.5 | 6.5 | 5.2 | 0.6 | 0.6 | 0.3 | 3.0 |
| Uniformity of lacquer coating | good | good | good | good | good | squashed | good |

Evaluation or explanation for the Table:
/1/ Cannot be determined since can only be peeled off with fabric layer
/2/ Peel angle 90°, peel speed 100 mm/min
/3/ Tensile test, clamped length 10 cm, sample width 1.5 cm, sample thickness 1 mm, extension rate 10 cm/min
/4/ The range indicates the uniformity of tearing Range 0 = no force peak, 0.6 = force peaks which are up to 0.6 N/mm apart
/5/ Strip to be peeled off tears at corners and edges which are not cleanly cut
/6/ MAN-Roland 600 sheet-fed offset printing press with lacquering unit, water-based lacquer Senolith ® Polylack, viscosity 30 sec
/7/ Weight increase in % after storage for 24 hours in water-based lacquer, based on relief layer, one-sided swelling with substrate film The mechanical data (hardness, elongation at break, tear propagation strength) of the printing plates (1a) and (1b) produced according to the invention, which are stated in the Table, have a good agreement with the data for the printing plates from the Comparative Experiments, i.e. printing plates (2a) and (2b). The only differences are in the uniformity of tearing according to DIN 53,507. In the force/distance diagram of the novel printing plates (1a) and (1b), no irregularities, i.e. no force peaks, are detectable. On the other hand, the printing plates of Comparative Experiments (2a) and (2b) show many force peaks. The samples tear irregularly.

This difference is decisive for the quality of mechanical structuring. The resolution of the novel printing plate (1b) is 1 mm. The sidewalls of the cutout elements are uniformly smooth. The sidewalls of the comparative printing plate (2b) on the other hand are jagged. The resolution of mechanical structuring is substantially lower here. In addition, the cuts often do not reach the corners of the image elements. During peeling, the corners are therefore raised or, in the case of small elements, removed entirely. The resolution of the mechanically structured rubber blanket is once again lower since, on peeling, not only the uppermost layer but also a fabric layer underneath must be peeled off. It is difficult to find the beginning of the layer to be peeled off. Furthermore, the fabric layer frays during peeling.

In photochemical structuring, the resolution is of course higher (0.02 mm). Here, the printing plate (1a) produced according to the invention does not differ substantially from the comparative printing plate (1b). The data have therefore been omitted from the Table. However, a decisive advantage is the fact that photochemical structuring of printing plate (1a) is possible without organic solvents.

In the print test, only printing plates (1a) and (1b) produced according to the invention give good results. The conventional printing plates and the rubber plate exhibit piling after only a few sheets, the print with the rubber blanket additionally exhibiting squash. Furthermore, in-register lacquer application by the rubber plate deteriorates during the print run.

We claim:

1. A process for the production of a flexible printing plate from a dimensionally stable printing plate, which dimensionally stable printing plate consists essentially of a dimensionally stable substrate and a photosensitive recording layer on the substrate, which process consists essentially of (1) uniformly exposing the photosensitive recording layer to light to produce a uniformly exposed recording layer, (2) imagewise cutting the uniformly exposed recording layer to produce nonprinting parts and printing parts of the recording layer, and (3) mechanically peeling the nonprinting parts of the recording layer away from the substrate leaving a substrate and printing parts of the recording layer on the substrate.

2. The process of claim 1, wherein a protective film is originally present on the recording layer.

3. The process of claim 2, wherein a nontacky release layer is present between the photosensitive recording layer and the protective film, which release layer is removed before or after the step of imagewise cutting.

4. The process of claim 1, wherein an adhesion-promoting layer is present between the recording layer and the dimensionally stable substrate.

5. The process of claim 1, wherein the dimensionally stable substrate is a plastic film.

6. The process of claim 4, wherein the adhesion of the recording layer is more than 1 N/cm and less than 10 N/cm, determined at a peel angle of 90° and a peel speed of 100 mm/min.

7. The process of claim 1, wherein the tensile strength of the recording layer is more than 0.2 N/mm$^2$ and less than 20 N/mm$^2$ determined at a clamped length of 10 cm, a sample width of 1.5 cm, a sample thickness of 1 mm and an extension rate of 10 cm/min.

8. The process of claim 1, wherein the hardness of the exposed recording layer, determined on a 6 mm sample, is more than 20, and less than 80 shore A.

9. The process of claim 1, wherein the photosensitive recording layer contains a mixture of a hydrophobic and a hydrophilic binder in amounts such that the exposed recording layer, when washed out with a developer, exhibits a weight increase of >1 and <30% by weight after storage for 24 hours in water at room temperature.

10. The process of claim 1, wherein the photosensitive recording layer contains a mixture of at least one elastic binder, at least one ethylenically unsaturated compound and at least one photoinitiator.

\* \* \* \* \*